(12) United States Patent
Hatanaka et al.

(10) Patent No.: US 11,189,482 B2
(45) Date of Patent: Nov. 30, 2021

(54) THIN FILM FORMATION METHOD

(71) Applicants: ULVAC, INC., Kanagawa (JP); INTERNATIONAL BUSINESS MACHINES CORPORATION, Armonk, NY (US)

(72) Inventors: Masanobu Hatanaka, Kanagawa (JP); Yohei Ogawa, Kanagawa (JP); Keon-chang Lee, Kanagawa (JP); Nobuyuki Kato, Kanagawa (JP); Takakazu Yamada, Kanagawa (JP); John Rozen, Hastings on Hudson, NY (US)

(73) Assignees: ULVAC, INC., Chigasaki (JP); INTERNATIONAL BUSINESS MACHINES CORPORATION, Armonk, NY (US)

( * ) Notice: Subject to any disclaimer, the term of this patent is extended or adjusted under 35 U.S.C. 154(b) by 136 days.

(21) Appl. No.: 16/347,904

(22) PCT Filed: May 11, 2018

(86) PCT No.: PCT/JP2018/018257
§ 371 (c)(1),
(2) Date: May 7, 2019

(87) PCT Pub. No.: WO2018/230213
PCT Pub. Date: Dec. 20, 2018

(65) Prior Publication Data
US 2019/0355576 A1 Nov. 21, 2019

(30) Foreign Application Priority Data
Jun. 12, 2017 (JP) .............................. JP2017-115268

(51) Int. Cl.
*C23C 16/32* (2006.01)
*H01L 21/02* (2006.01)
(Continued)

(52) U.S. Cl.
CPC ........ *H01L 21/02178* (2013.01); *C23C 16/32* (2013.01); *C23C 16/34* (2013.01);
(Continued)

(58) Field of Classification Search
CPC . C23C 126/32; C23C 16/34; C23C 16/45525; C23C 16/45536; C23C 16/32
See application file for complete search history.

(56) References Cited

U.S. PATENT DOCUMENTS 2,640,760 A * 6/1953 Heim ..................... C01B 32/914
423/439
8,697,551 B2 * 4/2014 Sakai ..................... H01L 33/005
438/478

(Continued)

FOREIGN PATENT DOCUMENTS

| JP | 2010508661 A | 3/2010 |
|----|--------------|--------|
| JP | 2013098214 A | 5/2013 |

(Continued)

OTHER PUBLICATIONS

Robinson, Gregory H., et al., "Synthesis and Molecular Structure of [Al(CH3)3][12]aneS4: A Novel Example of an Axially Stabilized Trigonal Bipyramidal Coordination of Aluminum". J. Am. Chem. Soc. 1988, 110, 1494-1497.*

(Continued)

*Primary Examiner* — Bret P Chen
(74) *Attorney, Agent, or Firm* — Caesar Rivise, PC (57) ABSTRACT

A thin film formation method includes setting a film formation subject to 200° C. or higher. A first step includes changing a first state, in which a film formation material and (Continued)

a carrier gas are supplied so that the film formation material collects on the film formation subject, to a second state, in which the film formation material is omitted. A second step includes changing a third state, in which a hydrogen gas and a carrier gas are supplied to reduce the film formation material, to a fourth state, in which the hydrogen gas is omitted. The film formation material is any one of $Al(C_xH_{2x+1})_3$, $Al(C_xH_{2x+1})_2H$, and $Al(C_xH_{2x+1})_2Cl$. The first step and the second step are alternately repeated to form an aluminum carbide film on the film formation subject such that a content rate of aluminum atoms is 20 atomic percent or greater.

11 Claims, 4 Drawing Sheets

(51) Int. Cl.
  *C23C 16/34* (2006.01)
  *C23C 16/455* (2006.01)
(52) U.S. Cl.
  CPC .... *C23C 16/45536* (2013.01); *H01L 21/0228* (2013.01); *H01L 21/02186* (2013.01); *H01L 21/02194* (2013.01)

(56) References Cited

U.S. PATENT DOCUMENTS

| | | | |
|---|---|---|---|
| 9,631,272 B2* | 4/2017 | Li | C23C 16/32 |
| 2005/0106877 A1 | 5/2005 | Elers et al. | |
| 2007/0148350 A1 | 6/2007 | Rahtu et al. | |
| 2008/0102204 A1 | 5/2008 | Elers | |
| 2008/0224235 A1 | 9/2008 | Lavoie et al. | |
| 2009/0315093 A1* | 12/2009 | Li | H01L 21/28088 |
| | | | 257/314 |
| 2011/0263115 A1 | 10/2011 | Ganguli et al. | |
| 2013/0078454 A1* | 3/2013 | Thompson | C23C 16/45525 |
| | | | 428/336 |
| 2013/0105908 A1 | 5/2013 | Saino | |
| 2013/0295298 A1* | 11/2013 | Gatineau | C07F 19/005 |
| | | | 427/576 |
| 2014/0112824 A1 | 4/2014 | Thompson et al. | |
| 2014/0127405 A1* | 5/2014 | Li | C23C 16/32 |
| | | | 427/249.17 |
| 2014/0273510 A1* | 9/2014 | Chen | H01L 21/28568 |
| | | | 438/763 |
| 2016/0376704 A1 | 12/2016 | Raisanen et al. | |
| 2017/0040172 A1 | 2/2017 | Moon et al. | |
| 2018/0122709 A1* | 5/2018 | Xie | H01L 21/28556 |
| 2019/0131418 A1* | 5/2019 | Ando | B82Y 10/00 |

FOREIGN PATENT DOCUMENTS

| | | |
|---|---|---|
| JP | 2016046414 A | 4/2016 |
| KR | 10-2017-0001617 A | 1/2017 |
| WO | 2004077515 A2 | 9/2004 |
| WO | 2006080782 A1 | 3/2006 |

OTHER PUBLICATIONS

Tibbetts, Katharine Moore, et al., "Amorphous aluminum-carbide and aluminum-magnesium-carbide nanoparticles from gas phase activation of trimethylaluminum and octamethyldialuminum-magnesium using simultaneous spatially and temporally focused ultrashort laser pulses." Nano-Structures & Nano-Objects 6 (2016) pp. 1-4.*

Itatani, Kiyoshi, et al., "Some Properties of Aluminum Carbide Powder Prepared by the Pyrolysis of Alkylaluminum." J. Am. Chem. Soc. 78 (3) 801-804 (1995).*

Jackson, David H.K., et al., "Optimizing AlF3 atomic layer deposition using trimethylaluminum and TaF5: Application to high voltage Li-ion battery cathodes". J. Vac. Sci. Technol. A 34(3), May/Jun. 2016.*

Moon, Jungmin, et al., "The Work Function Behavior of Aluminum-Doped Titanium Carbide Grown by Atomic Layer Deposition". IEEE Transactions on Electron Devices, vol. 63, No. 4, Apr. 2016, pp. 1423-1427.*

Moore Tibbetts, Katharine, et al., "Amorphous aluminum-carbide and aluminum-magnesium-carbide nanoparticles from gas phase activation of trimethylaluminum and octamethyldialuminum-magnesium using simultaneous spatially and temporally focused ultrashort laser pulses". Nano-Structures & Nano-Objects 6 (2016) 1-4.*

Pshyk, A.V., et al., "Low-temperature growth of epitaxial Ti2AlC MAX phase thin films by low-rate layer-by-layer PVD". Materials Research Letters, 7:6, (2019) 244-250. DOI: 10.1080/21663831. 2019.1594428.*

Klug, Jeffrey A., et al., "Atomic Layer Deposition of Amorphous Niobium Carbide-Based Thin Film Superconductors". J. Phys. Chem. C 2011, 115, 50, 25063-25071.*

King, W.R., et al., "Electrical Resistivity of Aluminum Carbide at 990-1240 K". J. Electrochem. Soc. (1985) vol. 132, No. 2, pp. 388-389.*

Marti, Robert M., et al., "NMR Crystallography of Aluminum Carbide: Impurities in the Reagent and Improved 27Al NMR Tensors". J. Phys. Chem. C 2020, 124, 7238-7243.*

International Search Report dated Jul. 4, 2008.
European Search Report dated Mar. 26, 2020.
International Search Report for PCT/JP2018/018257 dated Jul. 31, 2018.
Korean Office Action dated May 17, 2021 with Translation.

* cited by examiner

THIN FILM FORMATION METHOD

CROSS-REFERENCE TO RELATED APPLICATIONS

This application is a U.S. National Phase Application of PCT/JP2018/018257, filed May 11, 2018, which claims priority to JP2017-115268, filed Jun. 12, 2017, the contents of which applications are incorporated herein by reference in their entireties for all purposes.

TECHNICAL FIELD

The present invention relates to a thin film formation method for forming an aluminum carbide film.

BACKGROUND OF THE INVENTION

A transistor having a high-k metal gate (HKMG) structure and included in a semiconductor device is known. The HKMG structure is used to limit leakage current of a gate insulation film. In the HKMG structure, an insulator having a high permittivity is used as the material that forms the gate insulation film. Examples of the material forming the gate insulation film include hafnium oxide and aluminum oxide (for example, refer to patent document 1).

Additionally, in the HKMG structure, the material forming a gate electrode contains metals. The gate electrode includes a plurality of layers and is, for example, a lamination including a tungsten layer, a tungsten silicide layer, a titanium nitride layer, and a titanium layer (for example, refer to patent document 2).

Patent Document 1: Japanese Laid-Open Patent Publication No. 2013-098214

Patent Document 2: Japanese Laid-Open Patent Publication No. 2016-046414

SUMMARY OF THE INVENTION

The gate insulation film used in the HKMG structure has a tendency to form an oxygen deficit film, in which oxygen is deficient and does not satisfy the stoichiometric ratio. In such a case, it is known that the threshold voltage of the transistor changes depending on the oxygen deficit rate in the insulation film. To adjust the threshold voltage of the transistor to an appropriate value, there is a demand for a novel gate electrode formation material that is suitable for controlling the oxygen deficit rate in the gate insulation film. Particularly, an alloy that contains aluminum atoms is expected to be used. Before an amorphous aluminum carbide film is applied to the above gate electrode, it is desirable that the content rate of aluminum atoms in the aluminum carbide film be increased to 20 atomic percent or greater.

It is an object of the present invention to provide a thin film formation method that forms an aluminum carbide film in which the content rate of aluminum atoms is increased.

To achieve the above object, a thin film formation method includes a first step that sets a temperature of a film formation subject to 200° C. or higher and changes a first state, in which a film formation material containing aluminum and carbon and a carrier gas of the film formation material are supplied to the film formation subject so that the film formation material collects on the film formation subject, to a second state, in which supplying of the film formation material is omitted from the first state. The film formation material is any one selected from a group consisting of $Al(C_xH_{2x+1})_3$, $Al(C_xH_{2x+1})_2H$, and $Al(C_xH_{2x+1})_2Cl$, where x is an integer of one or greater in each general formula. The thin film formation method further includes a state that repeats the first step thereby forming an aluminum carbide film on a surface of the film formation subject such that the aluminum carbide film has a content rate of aluminum atoms that is 20 atomic percent or greater.

The above configuration allows for formation of the aluminum carbide film, in which the content rate of aluminum atoms is 20 atomic percent or greater, on the surface of the film formation subject.

Preferably, the above thin film formation method further includes a second step of changing a third state, in which an active species, which includes hydrogen produced by exciting a reduction gas containing hydrogen, and a carrier gas of the reduction gas are supplied to the film formation subject to reduce the film formation material, to a fourth state, in which supplying of the reduction gas is omitted from the third state and a state that alternately repeats the first step and the second step.

In the above configuration, the reduction of the film formation subject facilitates the formation of the aluminum carbide film from the film formation material.

In the above thin film formation method, the film formation material may be any one selected from a group consisting of dimethylaluminum hydride and diethylaluminum hydride.

In the above configuration, the film formation material contains hydrogen. This limits excessive content of carbon atoms in the aluminum carbide film, which is formed on the surface of the film formation subject, as compared to when the film formation material contains a hydrocarbon group instead of hydrogen. Thus, the specific resistance of the aluminum carbide film tends to be decreased.

Preferably, in the above thin film formation method, in a method for forming the aluminum carbide film, the film formation subject is placed in a vacuum chamber, the pressure of which is set within a range of 50 Pa to 1000 Pa, and the temperature of the film formation subject is set within a range of 200° C. to 500° C. so that the aluminum carbide film is formed to have a content rate of aluminum atoms that is 50 atomic percent or greater.

In the above configuration, when the aluminum carbide film needs to contain a certain amount of aluminum atoms, the aluminum carbide film is capable of containing the certain amount of aluminum atoms with a smaller thickness than an aluminum carbide film that contains aluminum atoms of lower concentration.

In the above thin film formation method, the surface of the film formation subject may include irregularities.

In the above configuration, the film formation material and hydrogen gas, which reduces the film formation material, are alternately supplied to the surface of the film formation subject. Consequently, the aluminum carbide film is formed through a reaction performed on the surface of the film formation subject. Thus, even when the surface has irregularities, variations in the thickness of the aluminum carbide film are limited between different portions of the surface.

The above thin film formation method may further include a formation step of forming the surface of the film formation subject so that the surface is conductive prior to the first step.

In the above configuration, the aluminum carbide film is formed on the conductive surface. This shorten the time for forming the aluminum carbide film on the surface of the film formation subject as compared to when the aluminum carbide film is formed on an insulative surface.

In the above thin film formation method, the film formation material includes a first film formation material. The thin film formation method may further include a third step of setting the temperature of the film formation subject to 200° C. or higher and changing a fifth state, in which a second film formation material containing aluminum and a carrier gas of the second film formation material are supplied to the film formation subject so that the second film formation material collects on the film formation subject, to a sixth state, in which supplying of the second film formation material is omitted from the fifth state. The second film formation material may be any one selected from a group consisting of 1-methylpyrrolidine alane, trimethylamine borane hydride alane, and dimethylaluminum i-propoxide.

In the above configuration, the third step forms a film that has higher concentration of aluminum than the aluminum carbide film formed by repeating the first step. This increases the concentration of aluminum in the aluminum carbide film as compared to when the aluminum carbide film is formed by repeating only the first step.

The above thin film formation method may include a state that repeats the third step.

In the above configuration, the proportion of the aluminum carbide film that is occupied by the film having higher concentration of aluminum than the aluminum carbide film formed by repeating the first step is increased in correspondence with the repetition of the third step. Thus, the concentration of aluminum is increased in the aluminum carbide film.

In the above thin film formation method, the film formation material includes a first film formation material. In the first state, a second film formation material containing aluminum may be further supplied to the film formation subject so that the second film formation material collects on the film formation subject. In the second state, supplying of the first film formation material and the second film formation material may be omitted from the first state. The second film formation material is any one selected from a group consisting of 1-methylpyrrolidine alane, trimethylamine borane hydride alane, and dimethylaluminum i-propoxide.

The above configuration increases the concentration of aluminum at a portion of the film formation subject on which the second film formation material is collected as compared to at a portion on which the first film formation material is collected. This increases the concentration of aluminum in the entire aluminum carbide film.

Preferably, in the above thin film formation method, the reduction gas includes at least one of hydrogen gas, hydrazine, and organic hydrazine.

In the above configuration, the excited species produced by the reduction gas reduces the film formation material.

In the above thin film formation method, in the third state, the reduction gas and the carrier gas may be supplied to the film formation subject that is heated or plasma generated by the reduction gas and the carrier gas is supplied to the film formation subject thereby supplying active species including the hydrogen to the film formation subject.

In the above configuration, the reduction gas may be excited on the film formation subject to supply excited species including hydrogen to the film formation subject or excited active species may be supplied to the film formation subject.

DETAILED DESCRIPTION OF THE PREFERRED EMBODIMENTS

First Embodiment

A first embodiment of a thin film formation method, which functions as an aluminum carbide film formation method, will now be described with reference to FIGS. 1 to 8. The schematic structure of an ALD apparatus that performs the aluminum carbide film formation method will be described first. Then, the aluminum carbide formation method and tests will be described.

Schematic Structure of ALD Apparatus

The schematic structure of an ALD apparatus will now be described with reference to FIG. 1. The ALD apparatus performs the aluminum carbide film formation method through an atomic layer deposition process.

Figure 1:
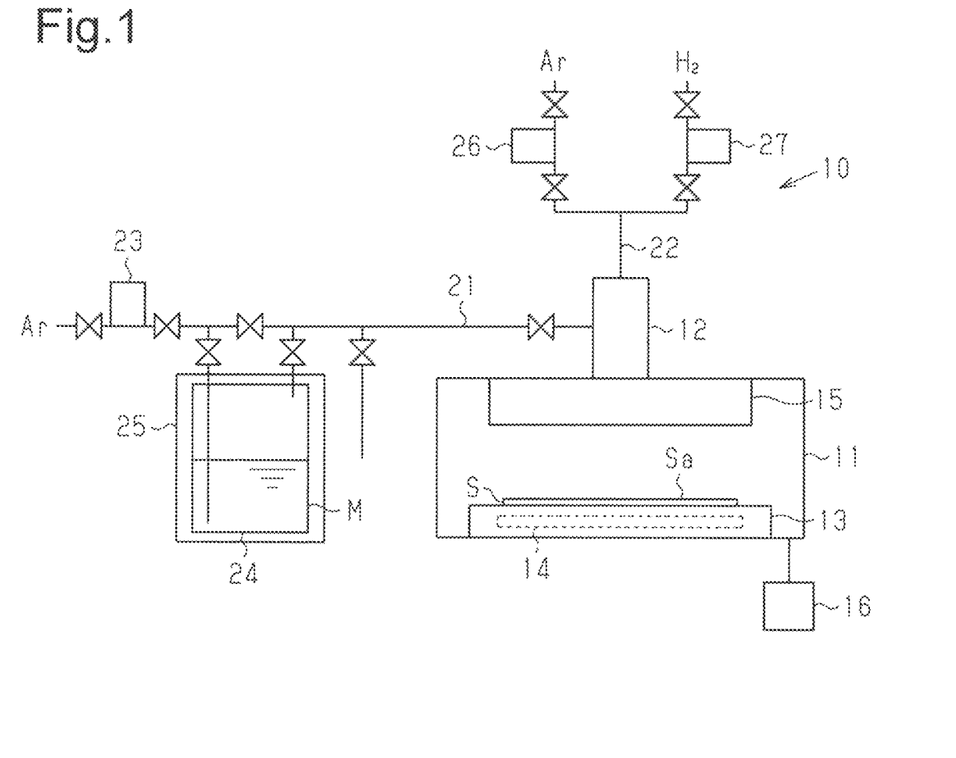
FIG. 1 is a block diagram showing the schematic structure of an ALD apparatus that performs a thin film formation method.

As shown in FIG. 1, an ALD apparatus 10 includes a box-shaped vacuum chamber 11. The vacuum chamber 11 is connected to an intake portion 12, which projects from the vacuum chamber 11 and draws various gases into the vacuum chamber 11. The vacuum chamber 11 accommodates a support portion 13, which supports a film formation subject S. The support portion 13 is, for example, a stage. The film formation subject S includes a surface Sa, on which an aluminum carbide film is formed. The surface Sa includes, for example, irregularities.

The support portion 13 accommodates a heater 14. The heater 14 increases the temperature of the film formation subject S, which is supported by the support portion 13, to a predetermined temperature, for example, within the range of 200° C. to 500° C. More preferably, the predetermined temperature is included in the range of 330° C. to 430° C.

The vacuum chamber 11 accommodates a dispersion unit 15, which is located at a position opposing the support portion 13 and connected to the intake portion 12. When gases are supplied to the vacuum chamber 11 through the intake portion 12, the dispersion unit 15 disperses the gases in the vacuum chamber 11. The dispersion unit 15 is, for example, a shower plate.

The vacuum chamber 11 is connected to a gas discharge unit 16, which discharges gases out of the vacuum chamber 11. The gas discharge unit 16 discharges the gases until the vacuum chamber 11 reaches predetermined pressure. The gas discharge unit 16 includes, for example, a vent pump and a valve.

The intake portion 12 is connected to a first pipe 21 and a second pipe 22. The first pipe 21 is connected to a first carrier gas supply unit 23 and a reservoir 24. The first carrier gas supply unit 23 is a mass flow controller that sends a carrier gas to the first pipe 21 at a predetermined flow rate.

The first carrier gas supply unit 23 supplies the carrier gas to the reservoir 24 by sending the carrier gas to the first pipe 21. The carrier gas is, for example, an argon (Ar) gas.

The reservoir 24 stores a film formation material M that forms an aluminum carbide film. The film formation material M contains aluminum and carbon. The film formation material M is any one selected from a group consisting of $Al(C_xH_{2x+1})_3$, $Al(C_xH_{2x+1})_2H$, and $Al(C_xH_{2x+1})_2Cl$. In each of the three general formulas, x is an integer of one or greater. In the ALD apparatus 10, when the film formation material M is heated or cooled, the film formation material M is vaporized. The gas of the film formation material M is transferred to the vacuum chamber 11 to form the aluminum carbide film.

In the above general formulas, $Al(C_xH_{2x+1})_3$ is referred to as the first general formula, $Al(C_xH_{2x+1})_2H$ is referred to as the second general formula, and $Al(C_xH_{2x+1})_2Cl$ is referred to as the third general formula. The first general formula includes, for example, trimethylaluminum (TMA) ($Al(CH_3)_3$), triethylaluminum (TEA) ($Al(C_2H_5)_3$), tripropylaluminum (TPA) ($Al(C_3H_7)_3$), and tributylaluminum (TBA) ($Al(C_4H_9)_3$).

The second general formula includes dimethylaluminum hydride (DMAH) ($Al(CH_3)_2H$), diethylaluminum hydride (DEAH) ($Al(C_2H_5)_2H$), dipropylaluminum hydride (DPAH) ($Al(C_3H_7)_2H$), and dibutylaluminum hydride (DBAH) ($Al(C_4H_9)_2H$).

The third general formula includes dimethylaluminum chloride ($Al(CH_3)_2Cl$), diethylaluminum chloride ($Al(C_2H_5)_2Cl$), dipropylaluminum chloride ($Al(C_3H_7)_2Cl$), and dibutylaluminum chloride ($Al(C_4H_9)_2Cl$).

When the substances included in the third general formula are used as the film formation material M, the aluminum carbide film may contain chlorine. It is preferred that the concentration of chlorine contained in the aluminum carbide film be five atomic percent or less and, more preferably, one atomic percent or less. The concentration of chlorine in the aluminum carbide film may be controlled by the temperature of the film formation subject S when forming the aluminum carbide film. Therefore, if the substances contained in the third general formula are used as the film formation material M, it is preferred that the aluminum carbide film be formed when the temperature of the film formation subject S is such that the concentration of chlorine in the aluminum carbide film is set to five atomic percent or less.

It is preferred that the film formation material M be any one selected from a group consisting of trimethylaluminum, triethylaluminum, dimethylaluminum hydride, and diethylaluminum hydride, which are included in the substances described above.

The reservoir 24 is covered by a temperature regulator 25. The temperature regulator 25 adjusts the temperature of the film formation material M stored in the reservoir 24 to a predetermined temperature. Accordingly, the temperature regulator 25 adjusts the vapor pressure of the film formation material M, which is stored in the reservoir 24, to a predetermined value.

When the argon gas is supplied from the first carrier gas supply unit 23 to the reservoir 24, the film formation material M is foamed in the reservoir 24. Consequently, the film formation material M is supplied together with the argon gas to the intake portion 12 through the first pipe 21.

The second pipe 22 is divided into two pipes at a position separated from the intake portion 12. One of the pipes is connected to a second carrier gas supply unit 26. The other one of the pipes is connected to a reduction gas supply unit 27. The second carrier gas supply unit 26 is a mass flow controller that sends a carrier gas to the second pipe 22 at a predetermined flow rate. The reduction gas supply unit 27 is a mass flow controller that sends a reduction gas to the second pipe 22 at a predetermined flow rate. As described above, the carrier gas is, for example, argon gas. The reduction gas is a gas containing hydrogen and, for example, hydrogen ($H_2$) gas. The argon gas and the hydrogen gas are supplied to the intake portion 12 through the second pipe 22.

In the ALD apparatus 10, the film formation material M and the hydrogen gas are alternately supplied to the surface Sa of the film formation subject S. Consequently, the film formation material M is collected on the surface Sa of the film formation subject S, which is heated to the predetermined temperature, and reduced by the hydrogen gas on the surface Sa of the film formation subject S. This forms an aluminum carbide (AlC) film on the surface Sa of the film formation subject S.

Aluminum Carbide Film Formation Method

A method for forming the aluminum carbide film will now be described with reference to FIGS. 2 and 3.

The aluminum carbide film formation method includes a first step and a second step. The first step sets the temperature of the film formation subject S to 200° C. or higher and changes a first state to a second state. In the first state, the film formation material M, which contains aluminum and carbon, and the carrier gas of the film formation material M are supplied to the film formation subject S so that the film formation material M collects on the film formation subject S. In the second state, supplying of the film formation material M is omitted from the first state. The second step sets the temperature of the film formation subject S to 200° C. or higher and changes a third state to a fourth state. In the third state, the hydrogen gas and the carrier gas of the hydrogen gas are supplied to the film formation subject S to reduce the film formation material M. In the fourth state, supplying of the hydrogen gas is omitted from the third state.

More specifically, in the second step, the third state corresponds to a state in which hydrogen gas, which is one example of reduction gas, and the carrier gas of the hydrogen gas are supplied to the heated film formation subject S. Thus, the reduction gas is excited to produce active species including hydrogen, and the active species and the carrier gas of the reduction gas are supplied to the film formation subject S to reduce the film formation material. The active species supplied to the film formation subject S is, for example, ions including hydrogen or radicals including hydrogen.

As described above, the film formation material M is any one selected from the group consisting of $Al(C_xH_{2x}+_1)_3$, $Al(C_xH_{2x+1})_2H$, and $Al(C_xH_{2x+1})_2Cl$. In the aluminum carbide film formation method, the first step and the second step are alternately repeated to form the aluminum carbide film, in which the content rate of aluminum atoms is 20 atomic percent or greater, on the surface Sa of the film formation subject S.

In the aluminum carbide film formation method, the aluminum carbide film in which the content rate of aluminum atoms is 20 atomic percent or greater is formed on the surface Sa of the film formation subject S.

Figure 2:
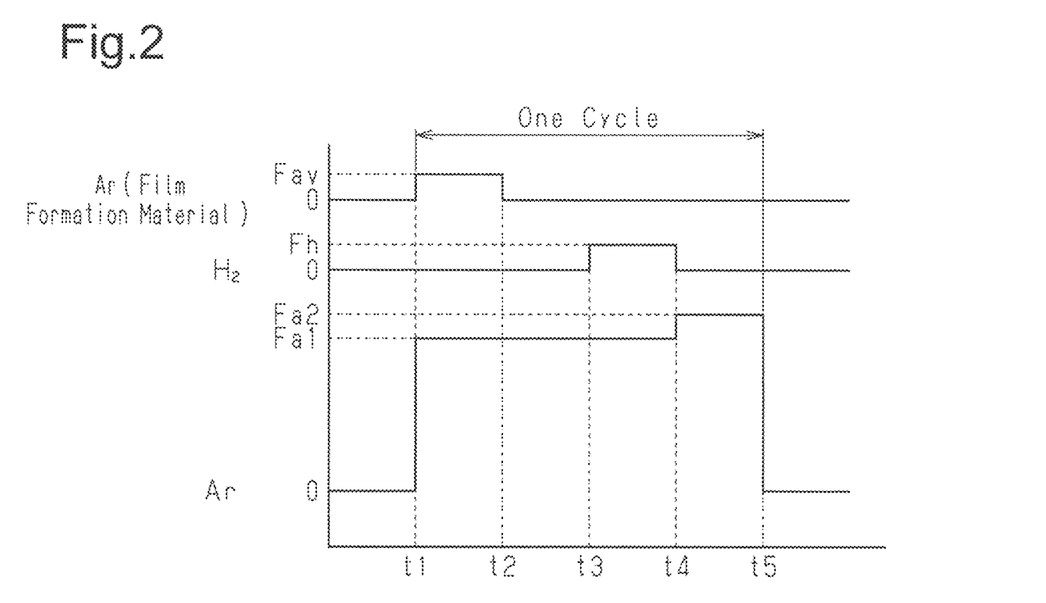
FIG. 2 is a timing chart showing the timing for supplying each gas in one embodiment of the thin film formation method.

More specifically, as shown in FIG. 2, in the aluminum carbide film formation method, at timing t1, the argon gas containing the film formation material M is supplied to the vacuum chamber 11 through the first pipe 21, and the argon gas is supplied to the vacuum chamber 11 through the second pipe 22. The argon gas supplied through the first pipe 21 and the argon gas supplied through the second pipe 22 each function as the carrier gas of the film formation material M. The flow rate of the argon gas supplied from the first pipe 21 is a predetermined flow rate Fav. The flow rate of the argon gas supplied from the second pipe 22 is a predetermined first flow rate Fa1. The first flow rate Fa1 is greater than the flow rate Fav of the argon gas supplied by the first carrier gas supply unit 23.

At timing t2, the supply of the argon gas containing the film formation material M to the vacuum chamber 11 is stopped, and the supply of the argon gas continues only through the second pipe 22. At this time, the flow rate of the argon gas supplied from the second pipe 22 is maintained at the first flow rate Fa1.

At timing t3, the supply of the hydrogen gas starts through the second pipe 22. The hydrogen gas is supplied together with the argon gas flowing through the second pipe 22 to the vacuum chamber 11. More specifically, the argon gas flowing through the second pipe 22 functions as the carrier gas of the hydrogen gas. At this time, the flow rate of the hydrogen gas is a predetermined flow rate Fh. The flow rate of the argon gas supplied from the second pipe 22 is maintained at the first flow rate Fa1. The first flow rate Fa1 is greater than the flow rate Fh of the hydrogen gas.

At timing t4, the supply of the hydrogen gas is stopped, and the supply of the argon gas only continues through the second pipe 22. At this time, the flow rate of the argon gas supplied from the second pipe 22 is changed to a second flow rate Fa2, which is greater than the first flow rate Fa1. At timing t5, the supply of the argon gas is stopped through the second pipe 22.

More specifically, from timing t1 to timing t2 corresponds to the first state. Timing t2 to timing t3 corresponds to the second state. Timing t1 to timing t3 corresponds to the first step. Timing t3 to timing t4 corresponds to the third state. Timing t4 to timing t5 corresponds to the fourth state. Timing t3 to timing t5 corresponds to the second step.

Timing t1 to timing t5 corresponds to one cycle. In the aluminum carbide film formation method, the cycle is repeated some tens of times to some hundreds of times in accordance with the thickness of the aluminum carbide film formed on the film formation subject S. When the cycle is repeated, timing t5 of an (n−1)th cycle is concurrent with timing t1 of an nth cycle. The argon gas continues to be supplied through the second pipe 22 until all of the cycles are performed.

The time from timing t1 to timing t2 is, for example, five seconds. The time from timing t2 to timing t3 is, for example fifteen seconds. The time from timing t3 to timing t4 is, for example, four seconds. The time from timing t4 to timing t5 is, for example, twelve seconds.

The flow rate Fav of the argon gas supplied together with the film formation material M to the vacuum chamber 11 is, for example, 100 sccm. The flow rate Fh of the hydrogen gas is, for example, 500 sccm. In the flow rates of the argon gas supplied through the second pipe 22, the first flow rate Fa1 is, for example, 3400 sccm, and the second flow rate Fa2 is, for example, 3800 sccm.

It is preferred that the film formation material M be any one selected from a group consisting of dimethylaluminum hydride and diethylaluminum hydride.

The specific resistance of the aluminum carbide film has a tendency to be increased as the content rate of carbon atoms is increased in the aluminum carbide film. Thus, it is preferred that the content rate of carbon atoms in the aluminum carbide film be less than or equal to a predetermined range. In this regard, when dimethylaluminum hydride and diethylaluminum hydride, which have fewer hydrocarbon groups than trimethylaluminum and triethylaluminum, are used as the film formation material M, the film formation material M is less likely to contain excessive carbon than when trimethylaluminum and triethylaluminum are used as the film formation material M.

More specifically, the film formation material M contains hydrogen. This limits excessive content of carbon atoms in the aluminum carbide film formed on the surface Sa of the film formation subject S as compared to when the film formation material M contains hydrocarbon groups instead of hydrogen. Thus, the specific resistance of the aluminum carbide film tends to be decreased.

In the aluminum carbide film formation method, it is preferred that the content rate of aluminum atoms in the aluminum carbide film be 20 atomic percent or greater, more preferably, 30 atomic percent or greater, and, further preferably, 50 atomic percent or greater. In the aluminum carbide film formation method, the pressure of the vacuum chamber 11, in which the film formation subject S is placed, is set within the range of 50 Pa to 1000 Pa. Additionally, the temperature of the film formation subject S is set within the range of 200° C. to 500° C. This allows for the formation of the aluminum carbide film in which the content rate of aluminum atoms is 50 atomic percent or greater.

More specifically, to obtain the aluminum carbide film in which the content rate of aluminum atoms is 20 atomic percent or greater, it is preferred that the pressure of the vacuum chamber 11 be set within the range of 50 Pa to 1000 Pa from timing t1 to timing t5. Additionally, it is preferred that the temperature of the film formation subject S be set within the range of 200° C. to 500° C. To obtain the aluminum carbide film in which the content rate of aluminum atoms is 50 atomic percent or greater, it is preferred that the pressure of the vacuum chamber 11 be set within the range of 100 Pa to 500 Pa from timing t1 to timing t5. Additionally, it is preferred that the temperature of the film formation subject S be set within the range of 330° C. to 430° C.

As described above, the surface Sa of the film formation subject S has irregularities. When the film formation material M and the hydrogen gas, which reduces the film formation material M, are alternately supplied to the surface Sa of the film formation subject S, the aluminum carbide film is formed through a reaction performed on the surface Sa of the film formation subject S. More specifically, the aluminum carbide film is formed on the surface Sa of the film formation subject S through the ALD process. Thus, even when the surface Sa has irregularities, variations in the thickness of the aluminum carbide film are limited between different portions of the surface Sa.

It is preferred that the aluminum carbide film formation method include a formation step prior to the first step and the second step. In the formation step, the conductive surface is formed as the surface of the film formation subject.

Thus, the aluminum carbide film is formed on the conductive surface Sa. This shortens the time for forming the aluminum carbide film on the surface Sa of the film formation subject S as compared to when the aluminum carbide film is formed on an insulative surface.

Figure 3:
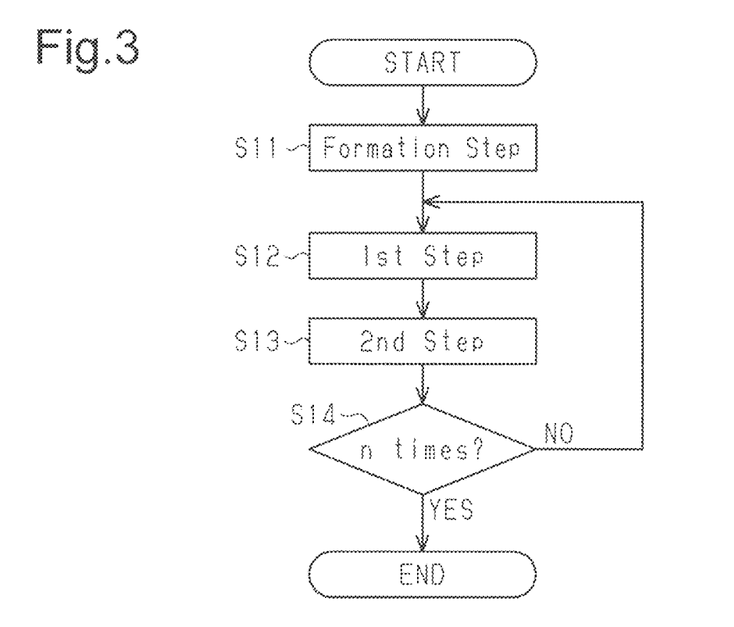
FIG. 3 is a flowchart showing the procedures of the thin film formation method.

More specifically, as shown in FIG. 3, the aluminum carbide film formation method includes the formation step (step S11), the first step (step S12), and the second step (step S13). The formation step is performed to form the conductive surface Sa. For example, a conductive film that differs from the aluminum carbide film is formed on a surface of an insulative substrate. Examples of the conductive film include a titanium nitride (TiN) film and a titanium aluminum carbide (TiAlC) film.

As described above, the first step and the second step are performed to form the aluminum carbide film. In the step for forming the aluminum carbide film, the first step and the second step are alternately repeated (step S14: NO) until the repetition is performed n times. When the first step and the second step are repeated n times (step S14: YES), the step for forming the aluminum carbide film temporarily ends.

Tests

The tests will be described with reference to FIGS. 4 to 8.

Surface of Film Formation Subject

First Test

A film formation subject was prepared. The film formation subject includes a silicon substrate and a thermally oxidized film formed on a surface of the silicon substrate, that is, a silicon oxide film. In other words, a film formation subject including an insulative oxide silicon surface was prepared. The aluminum carbide film was formed on the surface of the film formation subject under the condition described below.

Film Formation Material: Triethyl Aluminum

Carrier Gas: Argon Gas

Vacuum Chamber Pressure: within the range of 380 Pa to 400 Pa

Temperature of Film Formation Subject: 400° C.

Timing t1 to timing t2 was referred to as the first period. Timing t2 to timing t3 was referred to as the second period. Timing t3 to timing t4 was referred to as the third period. Timing t4 to timing t5 was referred to as the fourth period. Each period continues for the duration described below.

First Period: Five Seconds

Second Period: Fifteenth Seconds

Third Period: Four Seconds

Fourth Period: Twelve Seconds

In the first period, the flow rate of the argon gas supplied from the first carrier gas supply unit to the reservoir, which stored triethyl aluminum that was heated to 37° C., was set to 100 sccm. In the second period, the flow rate of the argon gas supplied from the first carrier gas supply unit to the first pipe bypassing the reservoir was set to 300 sccm, and a discharge valve of the first pipe was opened. In the third period, the flow rate of the hydrogen gas supplied from the reduction gas supply unit to the vacuum chamber was set to 500 sccm. The flow rate of the argon gas supplied from the second carrier gas supply unit to the vacuum chamber was set to 3400 sccm throughout the first to third periods and 3800 sccm in the fourth period.

The first to fourth periods were repeated in one hundred cycles to form an aluminum carbide film on the surface of the film formation subject. Consequently, a wafer of the first test was obtained.

Second Test

A film formation subject including a silicon substrate, a thermally oxidized film, and a titanium aluminum carbide film was prepared. In other words, a film formation subject including a conductive surface of titanium aluminum carbide was prepared. The titanium aluminum carbide film was formed through the ALD process, and the number of cycles was set to ten. Under the same condition as the first test, an aluminum carbide film was formed on the surface of the film formation subject. Consequently, a wafer of the second test was obtained.

Third Test

A film formation subject including a silicon substrate, a thermally oxidized film, and a titanium aluminum carbide film was prepared to obtain a wafer of the third test. In the third test, the titanium aluminum carbide film of the film formation subject was formed under the same condition as the second test except in that the number of cycles was set to twenty.

Evaluation

In each wafer of the first to third tests, the strength of aluminum atoms was measured using XRF (AZX400 manufactured by Rigaku Corporation).

Figure 4:
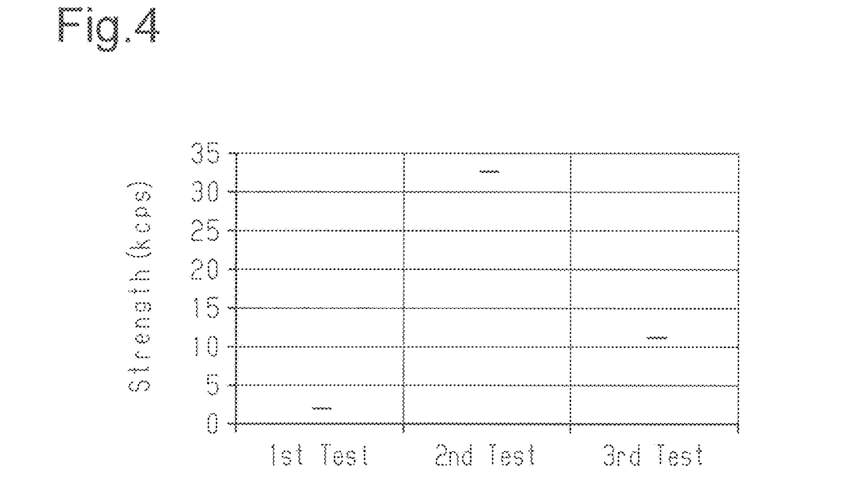
FIG. 4 is a graph showing the strength of aluminum atoms in an aluminum carbide film.

As shown in FIG. 4, the strength of the first test was 2.21 kcps, the strength of the second test was 32.89 kcps, and the strength of the third test was 11.40 kcps. More specifically, the strength of aluminum atoms derived from the aluminum carbide film of the first test was 2.21 kcps. The strength of aluminum atoms derived from the aluminum carbide film of the second test was greater than or equal to a value obtained by subtracting the strength of the third test from the strength of the second test and thus 21.49 kcps or greater and less than 32.89 kcps.

The above results show that the amount of the aluminum carbide film formed in the second test was greater than that formed in the first test. This indicates that when the surface of the film formation subject is conductive, a larger amount of the aluminum carbide film is formed than when the surface of the film formation subject is insulative. In other words, the time for forming the aluminum carbide film is shortened.

Content Rate of Aluminum Atoms

Fourth Test

A wafer of the fourth test was formed under the same condition as the second test except for the changes described below. More specifically, the temperature of the film formation material was set to 46.5° C. A film formation subject including a silicon substrate, a thermally oxidized film, and a titanium nitride film was prepared. After an aluminum carbide film was formed, the titanium nitride film was formed on the aluminum carbide film.

Evaluation

In the wafer of the fourth test, the atom concentration (atomic percent) in the thickness-wise direction of the wafer was measured through an XPS process.

Figure 5:
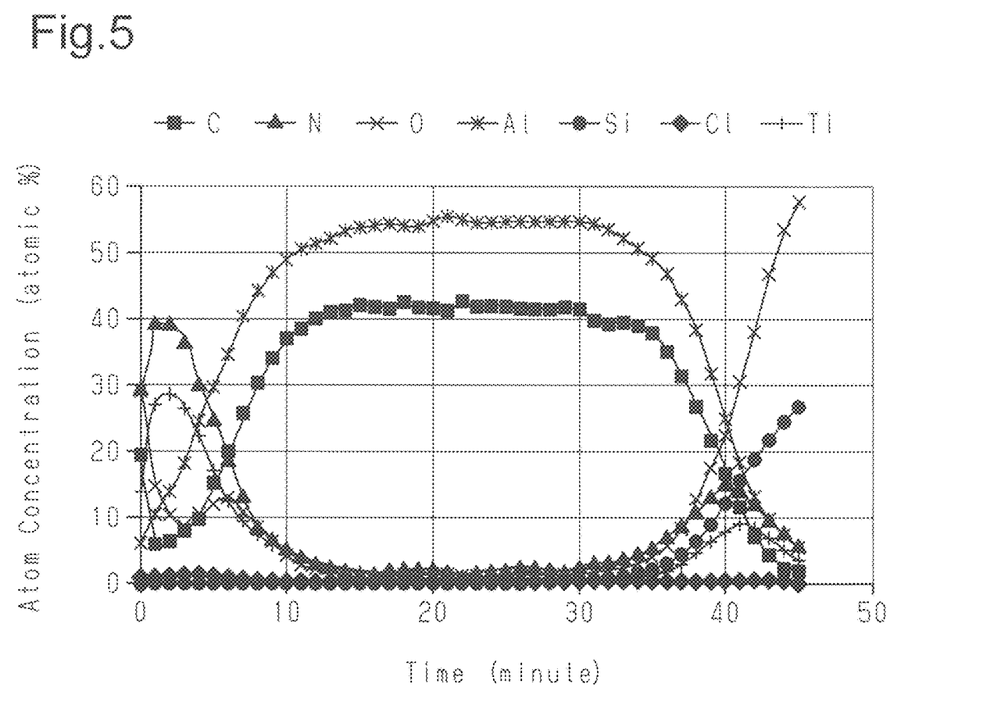
FIG. 5 is a graph showing the concentration of each atom contained in a wafer.

As shown in FIG. 5, the concentration of aluminum atoms and the concentration of carbon atoms were maintained in a substantially constant manner from fifteen to thirty minutes of sputtering time. This allows for the assumption that the atom concentration of the aluminum carbide film is the atom concentration obtained in the sputtering time from fifteen to thirty minutes.

In the aluminum carbide film, the concentration of aluminum atoms was determined that the maximum value was 56.36 atomic percent, the minimum value was 53.68 atomic percent, and the average value was 54.84 atomic percent. Additionally, in the aluminum carbide film, the concentration of carbon atoms was determined that the maximum value was 43.11 atomic percent, the minimum value was 41.50 atomic percent, and the average value was 42.17 atomic percent. Thus, in the aluminum carbide film, the ratio of the number of aluminum atoms and the number of carbon atoms is 54.84:42.17, that is, approximately 4:3. This indicates that the film formation method of the fourth test allows for the formation of the aluminum carbide film having a stoichiometric composition.

This shows that the aluminum carbide film formation method for forming the wafer of the fourth test allows for formation of the aluminum carbide film in which the content rate of aluminum atoms is 20 atomic percent or greater and, more specifically, 50 atomic percent or greater.

Recess Coverage

Figure 6:
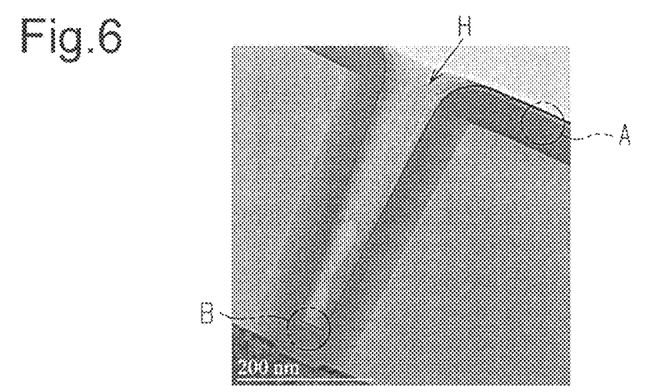
FIG. 6 is a TEM image showing a wafer including an aluminum carbide film.
Figure 7:
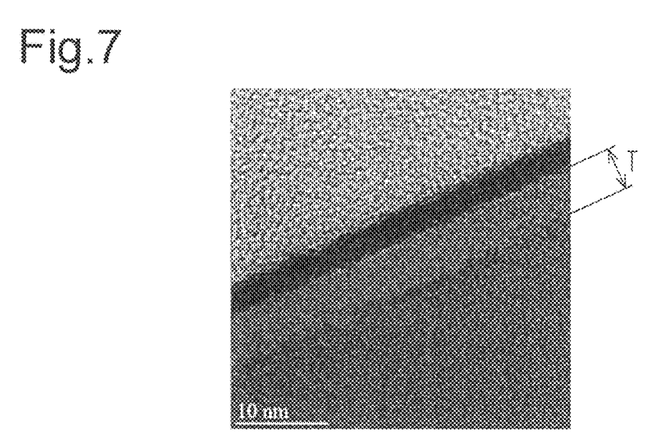
FIG. 7 is a TEM image showing region A of the wafer shown in FIG. 6.
Figure 8:
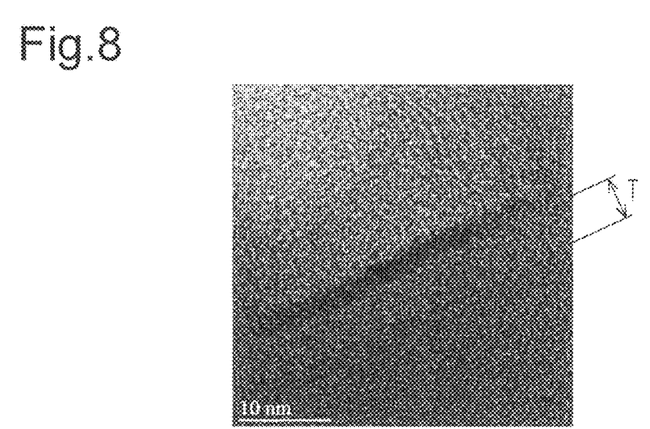
FIG. 8 is a TEM image showing region B of the wafer shown in FIG. 6.

The uniformity in the thickness of the aluminum carbide film will now be described with reference to FIGS. 6 to 8. FIGS. 6 to 8 are TEM images captured by a transmission electron microscope (TEM) and showing portions of a wafer of a fifth test.

Fifth Test

The wafer of the first test was formed under the same condition as the second test except for the changes described below.

More specifically, referring to FIG. 6, a number of recesses H, each of which has a diameter of 130 nm to 180 nm and a depth of 500 nm, were formed in a silicon substrate, and then a silicon nitride film was formed. The, a titanium nitride film was formed on the silicon nitride film to prepare a film formation subject. After an aluminum carbide film was formed on the film formation subject, the titanium nitride film was formed on the aluminum carbide film. FIG. 7 is a TEM image showing region A of FIG. 6. FIG. 8 is a TEM image showing region B of FIG. 6.

Evaluation

Referring to FIG. 7, the thickness T of a portion of the aluminum carbide film included in the region A was measured and determined that the minimum value was 4.79 nm and the maximum value was 5.04 nm. The calculated average value was 4.92 nm.

Referring to FIG. 8, the thickness T of a portion of the aluminum carbide film formed on the bottom of the recess H and included in the region B was measured and determined that the minimum value was 4.02 nm and the maximum value was 4.53 nm. The calculated average value was 4.28 nm.

More specifically, when the recess coverage on the surface of the film formation subject was assumed to be 100%, the recess coverage on the bottom of the recess H was 87.0%. This shows that the aluminum carbide film formation method allows for formation of the aluminum carbide film having a high recess coverage. In other words, the aluminum carbide film formation method allows for formation of the aluminum carbide film having a high uniformity in thickness even when the surface of the film formation subject has recesses.

Accordingly, the first embodiment of the thin film formation method has the advantages described below.

(1) The aluminum carbide film containing aluminum atoms of 20 atomic percent or greater is formed on the surface Sa of the film formation subject S.

(2) The film formation material M contains hydrogen. This limits excessive content of carbon atoms in the aluminum carbide film, which is formed on the surface Sa of the film formation subject S, as compared to when the film formation material M contains hydrocarbon groups instead of hydrogen. Thus, the specific resistance of the aluminum carbide film tends to be decreased.

(3) When the aluminum carbide film needs to contain a certain amount of aluminum atoms, the aluminum carbide film is capable of containing the certain amount of aluminum atoms with a smaller thickness than an aluminum carbide film that contains aluminum atoms of lower concentration.

(4) The film formation material M and the hydrogen gas, which reduces the film formation material M, are alternately supplied to the surface Sa to form the aluminum carbide film. Thus, even when the surface Sa has irregularities, variations in the thickness of the aluminum carbide film are limited between different portions of the surface Sa.

(5) The aluminum carbide film is formed on the conductive surface Sa. This shortens the time for forming the aluminum carbide film on the surface Sa of the film formation subject S as compared to when the aluminum carbide film is formed on an insulative surface.

The first embodiment may be modified as follows.

In the second step, instead of heating the film formation subject S, plasma may be generated by the reduction gas and the carrier gas of the reduction gas thereby supplying active species including hydrogen to the film formation subject S. In this case, the ALD apparatus 10 only needs to include a plasma generation unit, which generates plasma from the reduction gas and the carrier gas. In the second step, the heating of the film formation subject S and the plasma generation may both be performed to supply the active species to the film formation subject S.

The material forming the surface Sa of the film formation subject S is not limited to titanium nitride and titanium aluminum carbide, which have been described above. Alternatively, a conductive material conforming to titanium nitride and titanium aluminum carbide may be used. Even in such a configuration, the time for forming the aluminum carbide film may be shortened as compared to when the surface Sa of the film formation subject S is insulative.

The surface Sa of the film formation subject S does not necessarily have to be conductive. More specifically, the aluminum carbide film formation method does not necessarily have to include the step for forming the conductive surface Sa of the film formation subject S as a preprocess for forming the aluminum carbide film. Even in such a configuration, the aluminum carbide film may be formed on the surface Sa of the film formation subject S.

The surface Sa of the film formation subject S is not limited to a surface having irregularities and may be a flat surface. Even in such a configuration, the aluminum carbide film may be formed on the surface Sa of the film formation subject S.

The concentration of aluminum atoms contained in the aluminum carbide film may be less than 50 atomic percent as long as the concentration is 20 atomic percent or greater. Even when the concentration of aluminum atoms contained in the aluminum carbide film is less than 50 atomic percent, the aluminum carbide film may be formed on the surface Sa of the film formation subject S.

In the tests, triethyl aluminum was used as the film formation material M. Instead, the film formation material M may be any substance other than triethyl aluminum including $Al(C_xH_{2x+1})_3$, $Al(C_xH_{2x+1})_2H$, and $Al(C_xH_{2x+1})_2Cl$, which have been described. Even in such a case, the aluminum carbide film may be formed in the same manner as when triethyl aluminum is used.

The carrier gas is not limited to the argon gas and may be, for example, another noble gas. More specifically, the carrier gas only needs to supply the film formation material M and the reduction gas to the vacuum chamber 11 without reacting with the film formation material M and the reduction gas.

The reduction gas containing hydrogen is not limited to the hydrogen gas and may be hydrazine ($H_2NNH_2$) or organic hydrazine in which a hydrogen atom of hydrazine is substituted with an alkyl group ($C_nH_{2n+1}$). Examples of organic hydrazine in which one hydrogen atom is substituted with an alkyl group include monomethyl hydrazine ($N_2H_3(CH_3)$) and tert-butyl hydrazine ($N_2H_3(C_4H_9)$).

Examples of organic hydrazine in which two hydrogen atoms are substituted with alkyl groups include unsymmetrical dimethylhydrazine ($N_2H_2(CH_3)_2$). Examples of organic hydrazine in which three hydrogen atoms are substituted with alkyl groups include trimethylhydrazine ($N_2H(CH_3)$).

The reduction gas may include two or more of the hydrogen gas, hydrazine, and different kinds of organic hydrazine.

In the first state, that is, from timing t1 to timing t2, a second film formation material, which differs from the film formation material M, may be supplied together with the film formation material M to the film formation subject S. In this case, the film formation material M is one example of the first film formation material. The second film formation material contains aluminum and is any one selected from a group consisting of 1-methylpyrrolidine alane ($H_3Al:N(CH_3)(CH_2)_4$), trimethylamine borane hydride alane ($AlH_2(BH_4):N(CH_3)_3$), and dimethyl i-propoxide ($(CH_3)_2Al(OC_3H_7)$).

At a portion of the surface Sa of the film formation subject S on which the film formation material M is collected, aluminum carbide is produced through a reduction reaction of the film formation material M. Also, at a portion on which the second film formation material is collected, aluminum is produced through a reduction reaction of the second film formation material. In other words, the portion on which the second film formation material is collected has higher concentration of aluminum. This increases the concentration of aluminum atoms in the aluminum carbide film as compared to when the aluminum carbide film is formed using only the film formation material M.

When trimethylamine borane hydride alane is used as the second film formation material, the aluminum carbide film may contain boron. It is preferred that the concentration of boron in the aluminum carbide film be five atomic percent or less and, more preferably, one atomic percent or less. In the same manner as the concentration of chlorine, the concentration of boron in the aluminum carbide film may be controlled by the temperature of the film formation subject S when forming the aluminum carbide film. Therefore, when trimethylamine borane hydride alane is used as the second film formation material, it is preferred that the aluminum carbide film be formed when the temperature of the film formation subject S is such that the concentration of boron in the aluminum carbide film is five atomic percent or less.

In such a configuration, in the first state, that is, from timing t1 to timing t2, the film formation material M and the second film formation material are supplied together with the carrier gas to the film formation subject S. In the second state, that is, from timing t2 to timing t3, supplying of the film formation material M and supplying of the second film formation material are both omitted from the first state.

This configuration has the advantage described below.

(6) In the surface Sa of the film formation subject S, a portion on which the second film formation material is collected has higher concentration of aluminum than a portion on which the film formation material M is collected. This increases the concentration of aluminum in the entire aluminum carbide film.

In the cycle for forming the aluminum carbide film, the duration of each of the first state, the duration of the second state, the duration of the third state, and the duration of the fourth state are each one example. The duration of each state may be modified within a range allowing for formation of the aluminum carbide film in which the content amount of aluminum atoms is 20 atomic percent or greater. When the durations of the third state and the fourth state are set to zero, that is, when the third state and the fourth state are omitted, the aluminum carbide film in which the content amount of aluminum atoms is 20 atomic percent or greater may also be formed. Therefore, the second step, which includes the third state and the fourth state, may be omitted. However, when an aluminum carbide film is formed through a method including the third state and the fourth state, the aluminum carbide film has a higher film density and the film formation speed is increased. Thus, it is preferred that the third state and the fourth state be set to certain durations in the thin film formation method.

Second Embodiment

A second embodiment of a thin film formation method, which functions as an aluminum carbide film formation method, will now be described. The second embodiment differs from the first embodiment in that two different kinds of film formation materials are used when forming the aluminum carbide film. Hereafter, the description will focus on the differences from the first embodiment. The same configuration will not be described in detail.

Aluminum Carbide Film Formation Method

The present embodiment of the aluminum carbide film formation method further includes a third step that changes a fifth state to a sixth state. In the fifth state, a second film formation material containing aluminum and a carrier gas of the second film formation material are supplied to the film formation subject S so that the second film formation material collects on the film formation subject S. In the sixth state, supplying of the second film formation material is omitted from the fifth state.

The second film formation material is any one selected from the group consisting of 1-methylpyrrolidine alane, trimethylamine borane hydride alane, and dimethylaluminum i-propoxide. The carrier gas of the second film formation material is, for example, argon gas.

The aluminum carbide film formation method includes a state in which the third step and the second step are alternatively repeated.

More specifically, as described above, the aluminum carbide film formation method includes a number of cycles. Some of the cycles that include the first step and the second step are referred to as a first cycle. The remaining cycles that include the third step and the second step are referred to as a second cycle. The overall cycles include a state in which the first cycle is repeated and a state in which the second cycle is repeated.

In the overall cycles, the state in which the second cycle is repeated may be started from the first cycle or an intermediate cycle. Also, the state in which the second cycle is repeated may be ended in an intermediate cycle or include the final cycle. Further, the overall cycles may include the state in which the second cycle is repeated two or more times. When the number of the overall cycles is some tens of cycles, it is preferred that the number of the second cycles be less than ten or so. The aluminum film formed when the second cycle is repeated has higher concentration of aluminum than the aluminum film formed when the first cycle is repeated.

The second cycle and the first cycle may have the same timing for supplying each gas. More specifically, the timing for supplying each gas in the second cycle may be set to be the same as that in the first cycle except in that the second film formation material is supplied to the vacuum chamber 11 from timing t1 to timing t2, which are shown in FIG. 2. In this case, timing t1 to timing t2 corresponds to the fifth state, and timing t2 to timing t3 corresponds to the sixth state. Additionally, timing t3 to timing t4 corresponds to the third state, and timing t4 to timing t5 corresponds to the fourth state.

The second embodiment of the thin film formation method has the advantage described below in addition to advantages (1) to (5).

(7) When the first cycle is repeated, the aluminum carbide film is formed. When the second cycle is repeated, a film that has higher concentration of aluminum than the aluminum carbide film is formed. Thus, the aluminum carbide film formed by repeating the first cycle and the second cycle has higher concentration of aluminum than the aluminum carbide film formed by repeating only the first cycle.

The second embodiment may be modified as follows.

The duration of the fifth state in the second cycle and the duration of the first state in the first cycle may have different lengths. The duration of the sixth state in the second cycle and the duration of the second state in the first cycle may have different lengths.

The duration of the third state in the second cycle and the duration of the third state in the first cycle may have different lengths. The duration of the fourth state in the second cycle and the duration of the fourth state in the first cycle may have different lengths.

When a single aluminum carbide film is formed, the third step needs to be performed only one time or more. This forms the aluminum carbide film that has higher concentration of aluminum than an aluminum carbide film that is formed by performing only the first step and the second step in correspondence with the performance of the third step.

In such a configuration, the following advantage is obtained.

(8) The third step forms a film that has higher concentration of aluminum than the aluminum carbide film formed by repeating the first step. Thus, the concentration of aluminum in the aluminum carbide film is increased as compared to that of the aluminum carbide film formed by repeating only the first step.

The aluminum carbide film formation method may include a state that repeats only the third step instead of the state that alternately repeats the third step and the second step. In such a configuration, the following advantage is obtained.

(9) The proportion of the aluminum carbide film that is occupied by the film having higher concentration of aluminum than the aluminum carbide film formed by repeating the first step is increased in correspondence with the repetition of the third step. Thus, the concentration of aluminum is increased in the aluminum carbide film.

The invention claimed is:

1. A thin film formation method comprising:
a first step of setting a temperature of a film formation subject to 333° C. to 500° C. or higher and changing a first state, in which a film formation material containing aluminum and carbon and a carrier gas of the film formation material are supplied to the film formation subject so that the film formation material collects on the film formation subject, to a second state, in which supplying of the film formation material is terminated; and
a second step of changing a third state, in which an active species, which includes hydrogen produced by exciting a reduction gas containing hydrogen, and a carrier gas of the reduction gas are supplied to the film formation subject to reduce the film formation material, to a fourth state, in which supplying of the reduction gas is terminated, wherein
the film formation material is any one selected from a group consisting of $Al(C_x(C_xH_{2x+1})_3$, $Al(C_xH_{2x+1})_2H$, and $Al(C_xH_{2x+1})_2Cl$, where x is an integer of one or greater in each general formula,
in each of the first step and the second step, the film formation subject does not contact any carbon-containing compounds other than the film formation material, and
the thin film formation method further comprises a state that alternately repeats the first step and the second step, thereby forming an aluminum carbide film on a surface of the film formation subject such that the aluminum carbide film has a content rate of aluminum atoms that is 20 atomic percent or greater.

2. The thin film formation method according to claim 1, wherein the film formation material is any one selected from a group consisting of trimethylaluminum (TMA) ($Al(CH_3)_3$) and triethylaluminum (TEA) ($Al(C_2H_5)_3$).

3. The thin film formation method according to claim 2, wherein the film formation material is the triethylaluminum (TEA) ($Al(C_2H_5)_3$), and the temperature of the film formation subject is set within a range of 330° C. to 430° C.

4. The thin film formation method according to claim 1, wherein in a method for forming the aluminum carbide film, the film formation subject is placed in a vacuum chamber, the pressure of which is set within a range of 50 Pa to 1000 Pa.

5. The thin film formation method according to claim 1, wherein the surface of the film formation subject includes irregularities.

6. The thin film formation method according to claim 1, further comprising:
a formation step of forming the surface of the film formation subject so that the surface is conductive prior to the first step.

7. The thin film formation method according to claim 1, wherein the film formation material includes a first film formation material, the thin film formation method further comprising:
a third step of changing a fifth state, in which a second film formation material containing aluminum and a carrier gas of the second film formation material are supplied to the film formation subject so that the second film formation material collects on the film formation subject, to a sixth state, in which supplying of the second film formation material is terminated,
wherein the second film formation material is any one selected from a group consisting of 1-methylpyrrolidine alane, trimethylamine borane hydride alane, and dimethylaluminum i-propoxide.

8. The thin film formation method according to claim 7, further comprising: a state that repeats the third step.

9. The thin film formation method according to claim 1, wherein
the film formation material includes a first film formation material,
in the first state, a second film formation material containing aluminum is further supplied to the film formation subject so that the second film formation material collects on the film formation subject,
in the second state, supplying of the first film formation material and the second film formation material is terminated, and
the second film formation material is any one selected from a group consisting of 1-methylpyrrolidine alane, trimethylamine borane hydride alane, and dimethylaluminum i-propoxide.

10. The thin film formation method according to claim 1, wherein the reduction gas includes at least one of hydrogen gas, hydrazine, and organic hydrazine.

11. The thin film formation method according to claim 1, wherein the third state supplies the reduction gas and the carrier gas to the film formation subject that is heated or supplies a plasma generated by the reduction gas and the carrier gas to the film formation subject, thereby supplying an active species including the hydrogen to the film formation subject.

* * * * *